US006455106B1

(12) United States Patent
Qiu et al.

(10) Patent No.: US 6,455,106 B1
(45) Date of Patent: *Sep. 24, 2002

(54) METHOD OF FORMING OXIDE-CERAMICS FILM

(75) Inventors: Hong Qiu, Beijing (CN); Kouji Sumi, Nagano (JP); Masato Shimada, Nagano (JP); Tsutomu Nishiwaki, Nagano (JP); Kazumasa Hasegawa, Nagano (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/381,163

(22) PCT Filed: Jan. 19, 1999

(86) PCT No.: PCT/JP99/00167

§ 371 (c)(1),
(2), (4) Date: Dec. 28, 1999

(87) PCT Pub. No.: WO99/36353

PCT Pub. Date: Jul. 22, 1999

(30) Foreign Application Priority Data

Jan. 19, 1998 (JP) .......................................... 10-008019
Dec. 7, 1998 (JP) .......................................... 10-347372

(51) Int. Cl.$^7$ .............................. B05D 3/02; B05D 3/10; B05D 3/00
(52) U.S. Cl. .................... 427/372.2; 427/377; 427/369; 427/370
(58) Field of Search ................................ 427/377, 370, 427/369, 372.2

(56) References Cited

U.S. PATENT DOCUMENTS

| | | | | |
|---|---|---|---|---|
| 5,391,393 A | * | 2/1995 | Maniar | 427/100 |
| 5,593,495 A | * | 1/1997 | Masuda et al. | 117/4 |
| 5,635,250 A | * | 6/1997 | Blum et al. | 427/387 |
| 5,728,603 A | * | 3/1998 | Emesh et al. | 437/235 |
| 5,853,514 A | * | 12/1998 | Takeuchi et al. | 156/89.12 |
| 5,886,867 A | * | 3/1999 | Chivukula et al. | 361/311 |
| 5,958,815 A | * | 9/1999 | Loebmann et al. | 501/134 |
| 6,066,581 A | * | 5/2000 | Chivukula et al. | 501/12 |

FOREIGN PATENT DOCUMENTS

| | | |
|---|---|---|
| JP | 3-5306 | 1/1991 |
| JP | 3-212905 | 9/1991 |
| JP | 5-43241 | 2/1993 |
| JP | 5-85706 | 4/1993 |
| JP | 5-221643 | 8/1993 |
| JP | 9-157019 | 6/1997 |

OTHER PUBLICATIONS

Merriam–Webster's Collegiate Dictionary, 10$^{th}$ ed., p. 1182 (1999, no mo.).*

* cited by examiner

Primary Examiner—Shrive P. Beck
Assistant Examiner—Michael Cleveland
(74) Attorney, Agent, or Firm—Sterne, Kessler, Goldstein & Fox P.L.L.C.

(57) ABSTRACT

A process for the formation of an oxide ceramic thin film, which permits the control of film oxygen content and can give a film reduced in oxygen deficiency. The process is characterized in that the step of forming an amorphous thin film, the step of heating the thin film to crystallize it or the step of heat-treating the crystallized film is conducted in a moisture-containing atmosphere.

4 Claims, No Drawings

METHOD OF FORMING OXIDE-CERAMICS FILM

BACKGROUND OF THE INVENTION

1. Field of she Invention

The present invention relates to a method of forming; an oxide-ceramics film to be applied to an electronics device using the ferroelectricity, piezoelectricity, pyroelectricity, conductivity, transducency, and capacity of the film.

2. Description of the Related Art

As related art pertaining to the present invention, there is a paper reported in the Japanese Journal of Applied Physics 1997, Volume 36, pages 5803–5807. With respect to the method of forming a lead zirconate titanate ("PZT") ceramics film of such related art, the PZT film is formed by dip-coating an organometallic compound solution (sol) on a substrate, drying it at 110° C., pyrolyzing it at 350° C., and crystallizing it at 500° C. These heat-treatment processes are usually carried out in air or oxygen.

Nevertheless, according to the method of forming PZT films in the aforementioned related art, it is difficult to control the amount of oxygen in the film during the heat-treatment processes of drying, pyrolyzing, and crystallizing carried out under air- or oxygen-atmosphere. In an experiment conducted by the present inventors, for example, the sol used was prepared by dissolving lead acetate (II) tri-hydrate, zirconium acetyl acetonate, and titanium tetra-isopropoxide with 2-n-butoxyl ethanol, and further adding polyethylene glycol. The sol was then spin-coated onto a substrate, dried, pyrolyzed, and crystallized all in air. The PZT film suffered approximately 40% of oxygen deficiency in comparison with the sol stoichiometric composition.

The present invention was devised in view of the foregoing problems of the conventional art, and an object thereof is to provide a method of forming an oxide-ceramics film capable of controlling the amount of oxygen in the film and with little oxygen deficiency.

Another object of the present invention is to provide a method of forming an oxide-ceramics film which prevents the escape of oxygen during the preparation process.

SUMMARY OF THE INVENTION

In order to achieve the aforementioned objects, the method of forming the oxide-ceramics film according to the present invention is characterized by the following points.

(1) In a method of forming an oxide-ceramics film comprising a step of forming an amorphous film on an arbitrary substrate and a step of heating the arbitrary substrate and amorphous film for crystallization, at least one or more of the steps among the step of forming an amorphous film, the step of heating the amorphous film for crystallization, and the step of these processings to be conducted thereafter include a step of processing under an atmosphere including moisture.

In the present invention, "atmosphere including moisture" shall include a 100% water atmosphere such as inside a water tank as well as an aqueous vapor atmosphere.

(2) The step of processing under an atmosphere including moisture uses supercritical water as the moisture.

(3) The step of forming an amorphous film uses a sol-gel method or sputtering method. The sol-gel method includes a step of coating a sol solution on the arbitrary substrate and a step of drying the coated sol solution.

(4) The oxide-ceramics film is a lead zirconate titanate film.

(5) When performing the step of processing under an atmosphere including moisture during the heat-treatment process, the moisture is 100% water.

(6) The step of processing under an atmosphere including moisture is performed upon setting the pressure of the atmosphere lower than 200 atmospheric pressure.

(7) The temperature of the heat-treatment process is set at 700° C. or lower.

(8) In a method of forming an oxide-ceramics film comprising a step of forming an amorphous film on an arbitrary substrate and the step of crystallizing the amorphous film, the amorphous film is crystallized by hydrothermal treatment being performed under water.

(9) During the step of crystallizing the amorphous film, hydrothermal treatment is performed upon using water in which pH is adjusted to 7.

(10) During the step of crystallizing the amorphous film, hydrothermal treatment is performed upon setting the pressure in a range between 2 and 20 atmospheric pressure.

(11) During the step of crystallizing the amorphous film, hydrothermal treatment is preformed upon setting the temperature in a range between 120° C and 250° C.

DESCRIPTION OF THE PREFERRED EMBODIMENTS

Examples of the present invention are explained in detail below.

EXAMPLE 1

Example 1 according to the present invention pertains to a method of forming an oxide-ceramics film, wherein the pyrolyzing of the PZT amorphous film is performed under an atmosphere including water.

The substrate used was prepared by forming a 1 $\mu$m thermal oxidized $SiO_2$ film on a single-crystal silicon substrate. A multilayer as the bottom electrode was formed in the order of titanium 200A, platinum 2000A, and titanium 50A by sputtering deposition on the $SiO_2$ film. Next, a PZT sol solution was spin-coated on the bottom electrode. The sol solution used was prepared by dissolving lead acetate (II) tri-hydrate, zirconium acetyl acetonate, and titanium tetra-isopropoxide with 2-n-butoxyl ethanol, and further adding polyethylene glycol. The Pb:Zr:Ti in the solution was adjusted to be 110:52:48. After coating the sol solution, drying was conducted in two steps at 80° C. and 200° C. in air, and gelling of the sol solution was performed. Pyrolysis of the gelled PZT amorphous film was carried out at 400° C., under air atmosphere, 100% water atmosphere/1 atmospheric pressure, and 100% water atmosphere/100 atmospheric pressure. The time was set to 30 minutes. As the critical point of water is 374° C./218 atmospheric pressure, the water here is in a supercritical condition. The composition of the PZT film after this processing was measured with EDX (energy dispersive X-rays micro-analyzer). The characteristic X-ray spectra measured were PbM $\alpha$ ray (2.38keV), TiK $\alpha$ ray (4.52 keV), and OK $\alpha$ ray (0.52 keV). The Pb/Ti ratio and O/Ti ratio of the intensity of the characteristic X-ray in the respective samples are shown in Table 1

TABLE 1

| Intensity ratio of characteristic X-ray when atmosphere is changed during pyrolyzing at 400° C. | | |
|---|---|---|
| Atmosphere | Pb/Ti | O/Ti |
| Air | 7.2 | 1.3 |
| 100% Water/1 Atmospheric Pressure | 7.2 | 1.6 |
| 100% Water/100 Atmospheric Pressure | 2.3 | 1.7 |

When the atmosphere pyrolyzing at 400° C. is 100% water/1 atmospheric pressure, the O/Ti ratio was 1.6, showing a slight increase n comparison to the 1.3 of the air atmosphere, and suggests a slight increase in the amount of oxygen in the PZT film. Therefore, by including water in the atmosphere during pyrolyzing the PZT amorphous film formed by the sol-gel method, it is possible to control the amount of oxygen in the PZT film. Moreover, when the atmosphere is 100% water/100 atmospheric pressure, the Pb/Ti ratio was 2.3, showing a sudden decrease in comparison to the 7.2 of the other conditions, and suggests a deficiency of the lead in the film. After this processing, the films were evaluated with XRD (X-ray diffraction), and no specific sharp diffraction peak could be found, suggesting that the films were an amorphous structure.

Next, a sample, prepared by four spin coatings on the bottom electrode and each coating heat treated at 200° C., was similarly processed at 400° C. A rectilinear crack was found in the case of air atmosphere, but no crack was found in the cases of 100% water/1 atmospheric pressure and 100% water/100 atmospheric pressure. Accordingly, by including water in the atmosphere upon pyrolyzing, it is considered that the stress in the PZT film during pyrolyzing and thereafter can be relaxed, and cracks can be prevented.

The above is an example of including water in the atmosphere during pyrolyzing an amorphous film upon forming a PZT film with the sol-gel method. Nevertheless, in the present example, after drying or pyrolyzing the coating layer, a heat treatment under the atmosphere including water may be also provided in terms of the present invention. The film material is not limited to PZT, but may also be a PZT group material, such as material in which lead magnesium niobate is added to PZT, or the present invention may be applied to other ceramics materials, such as lead lanthanum titanate ((Pb, La) $TiO_3$), lead lanthanum zirconate ((Pb, La) $ZrO_3$), lead lanthanum zirconate titanate ((Pb, La)(Zr, Ti) $O_3$: PLZT), lead magnesium niobate zirconate titanate (Pb (Mg, Nb) (Zr, Ti) $O_3$: PMN-PZT), strontium titanate, lithium niobate, zirconia, Y-1, ITO, and so on. Furthermore, other than the sol-gel method for forming films, the MOD (Metallo-Organic Decomposition) method and sputtering method may be used to form the amorphous film.

EXAMPLE 2

Example 2 of the present invention pertains to the method of forming an oxide-ceramics film, wherein heat treatment is performed under an atmosphere including water after the crystal growth of the PZT film.

The substrate used was prepared by forming a 1 $\mu m$ thermal oxidized $SiO_2$ film on a single-crystal silicon substrate. A multilayer as the bottom electrode was formed in the order of titanium 200A, platinum 2000A, and titanium 50A by sputtering deposition on the $SiO_2$ film. Next, a PZT sol solution was spin coated on the bottom electrode. The sol solution used was prepared by dissolving lead acetate (II) tri-hydrate, zirconium acetyl acetonate, and titanium tetra-isopropoxide with 2-n-butoxyl ethanol, and further adding polyethylene glycol. The Pb:Zr:Ti in the material solution was adjusted to be 110:52:48. After coating the sol solution, drying was conducted in two steps at 80° C. and 200° C. under air atmosphere, and gelling of the sol solution was performed. Pyrolysis of the gelled PZT film was conducted at 400° C. under air atmosphere. And as a step of crystallizing the amorphous film, infrared rapid-thermal annealing ("RTA") was conducted successively in two steps at 650° C. and 900° C. under air atmosphere. Heat treatment was performed to the crystallized sample for 30 minutes under a 100% water atmosphere, temperature of 400~600° C., and pressure 100~1000 atmospheric pressure. The composition of the PZT film after this processing was measured with EDX. The characteristic X-ray spectra measured were PbM α ray (2.38 keV), TiK α ray (4.52 keV), and OK α ray (0.52 keV). The Pb/Ti ratio and O/Ti ratio of the intensity of the characteristic X-ray in the respective samples are shown in Table 2.

TABLE 2

Intensity ratio of characteristic X-ray upon performing 100% water heat treatment after RTA crystallization.

| Treating Temperature (° C.) | Water Pressure (Atmospheric Pressure) | Pb/Ti | O/Ti |
|---|---|---|---|
| none | none | 7.4 | 2.0 |
| 400 | 200 | 7.4 | 2.0 |
| 600 | 100 | 7.3 | 2.8 |
| 600 | 200 | 7.3 | 2.8 |
| 600 | 1000 | 6.5 | 2.0 |
| 700 | 100 | 6.7 | 2.1 |
| 800 | 100 | 4.5 | 1.2 |

The Pb/Ti ratio and O/Ti ratio in the case of 400° C./200 atmospheric pressure was the same as in the case of no treating. When treating at 600° C./100 atmospheric pressure and 600° C./200 atmospheric pressure, the O/Ti ratio was 2.8, showing an increase in comparison to the 2.0 of no treating, and suggests an increase in the amount of oxygen in the PZT film. Therefore, by performing heat treatment in an atmosphere including water after the crystal growth upon forming the PZT film with the sol-gel method, it is possible to control the amount of oxygen in the PZT film. When treating at 600° C./100 atmospheric pressure and 600° C./200 atmospheric pressure, the Pb/Ti ratio was 7.3, substantially the same as the 7.4 of no treating. When treating at 1000 atmospheric pressure, however, the Pb/Ti ratio was 6.5, showing an apparent decrease. The Pb/Ti ratio in cases of 700° C./100 atmospheric pressure and 800° C./100 atmospheric pressure also showed a clear decrease in comparison to no treating. Suggested from this decrease in the Pb/Ti ratio is that Pb is missing in the PZT film during heat treatment under high-pressure and high-temperature water atmosphere. A top electrode was formed by mask vaporizing aluminum to these samples, and the D-E hysteresis loop was examined using a Sawyer Tower circuit. Thereupon, with respect to samples treated under the conditions of 600° C./1000 atmospheric pressure processing and 800° C./100 atmospheric pressure, no hysteretic loop characteristic to ferroelectric substances could be observed, but such characteristic was observed in the remaining samples. Accordingly, when performing heat treatment under an atmosphere including water to crystallize PZT or PZT group ceramics films, it is preferable that it is a 100% water atmosphere, the atmosphere is lower than 200 atmospheric pressure, and the temperature is lower than 700° C.

The above is an example of performing heat treatment under an atmosphere including water after crystal growth upon forming a PZT film with the sol-gel method. Nevertheless, heat treatment may also be performed under an atmosphere including water at the time of the film crystallization. The film material is not limited to lead zirconate titanate (Pb (Zr, Ti) $O_3$: PZT), and the present invention may be applied to other ceramics materials, such as lead lanthanum titanate ((Pb, La) $TiO_3$), lead lanthanum zirconate ((Pb, La) $ZrO_3$), lead lanthanum zirconate titanate ((Pb, La) (Zr, Ti) $O_3$: PLZT), lead magnesium niobate zirconate titanate (Pb (Mg, Nb) (Zr, Ti) $O_3$: PMN-PZT), strontium titanate, lithium niobate, zirconia, Y-1, ITO, and so on. Furthermore, other than the sol-gel method for forming films, the MOD (Metallo-Organic Decomposition) method, sputtering method, and vaporization method may be used to form the amorphous film.

EXAMPLE 3

Example 3 of the present invention pertains to the method of forming an oxide-ceramics film, wherein hydrothermal treatment is performed, after pyrolyzing, to an amorphous gelled film in water.

An oxide-ceramics sol is foremost synthesized. For example, titanium tetra-isopropoxide, penta-ethoxyniobate, and tetra-n-propoxy zirconium are mixed with 2-n-butoxyl ethanol and agitated for 20 minutes under room temperature. Next, diethanolamine is added and agitated for another 20 minutes under room temperature. Thereafter, lead acetate and magnesium acetate are added and heated to 80° C., agitated for 20 minutes in this state, and thereafter cooled naturally until room temperature. The metal alkoxide solution synthesized with the aforementioned steps is used as the sol. The synthesizing method of the sol, however, is not limited to the above.

Then, an insulating film is formed on the silicon substrate. For example, the silicon substrate has a thickness of approximately 200 μm, and the $SiO_2$ insulating film is formed with a thickness of approximately 1μm. A well-known method such as the thermal oxidation method is used for preparing the insulating film. The bottom electrode is formed thereafter. A titanate layer or platinum layer having a thickness of 0.1 μm~0.2 μm is deposited on the insulating film. A well-known method such as the direct current sputtering method is used for depositing these layers.

Next, the sol synthesized with the aforementioned method is used to form an amorphous precursor film. An amorphous film made from multilayers (four layers for example) is formed by coating sol on the bottom electrode and repeating the steps of drying and pyrolyzing each layer. The above-synthesized metal alkoxide solution is spin-coated on the bottom electrode in an even thickness. When using the well-known spin-coating method, for example, the coating of sol is conducted in sequence for 30 seconds at 500 rotations per minute, 30 seconds at 1500 rotations per minute, and 10 seconds at 500 rotations per minute for each layer. The method of coating sol, however, is:not limited to the above and other various methods may be employed.

At the stage of coating sol, each of the metal atoms structuring the PZT is dispersed as an organic metal complex. After coating, it is dried at a prescribed temperature (180° C. for example) for a prescribed period of time (10 minutes for example). Moisture evaporates by this drying. Thereafter, it is further pyrolyzed under an atmospheric atmosphere at a prescribed temperature (within a range of 300° C.~400° C., preferably 350° C.) for a prescribed period of time (30~60 minutes). By pyrolyzing, the organic substance configured on the metal separates from the metal and generates an oxidation-combustion reaction and scatters into the atmosphere. The precursor film remaining after pyrolyzing is an amorphous film composed of metal and oxygen only. Each of these steps of coating→drying→pyrolyzing is repeated a prescribed number of times, such as four times, and four thin layers are formed. Multilayer coatings are used in order to prepare the thicker crack-free film.

Next, hydrothermal treatment is performed for crystallizing the amorphous-gelled film. Water is foremost filled in a water tank. The precursor film prepared in the aforementioned step is submerged in the water tank inclusive of the substrate, and the crystallization of the precursor film thereof is promoted in an autoclave under a prescribed condition. The condition of the water requires that pH is adjusted to 7. The hydrothermal treatment pressure is set between 2 atmospheric pressure and 20 atmospheric pressure. Preferably, the pressure is set to approximately 10 atmospheric pressure. The hydrothermal treatment temperature is set in a range between 120° C. and 250° C. Preferably, the treating temperature is set to approximately 200° C. The hydrothermal treatment time is set between 10 minutes and 60 minutes. The treating time is set to 30 minutes for example.

Finally, a top electrode is deposited on the crystallized oxide-ceramics film using the electronic beam vaporization method, sputtering method, and the like. Platinum (Pt) is used as the top electrode material, and the thickness thereof is approximately 100 nm.

EXAMPLE 4

Example 4 of the present invention pertains to the method of forming an oxide-ceramics film, wherein an amorphous precursor film is prepared by the sputtering method and crystallized by the hydrothermal treatment in water.

An insulating film is formed on the silicon substrate. For example, the silicon substrate has a thickness of approximately 200 μm, and the $SiO_2$ insulating film is formed with a thickness of approximately 1 μm. A well-known method such as the thermal-oxidation method is used for preparing the insulating film. The bottom electrode is formed thereafter. A titanium layer or platinum layer having a thickness of 0.1 μm is deposited on the insulating film. A well-known method such as the direct current sputtering method is used for depositing these layers.

Next, a PZT precursor film is formed by the sputtering method. To be included in the sample atoms are atoms composing the PZT film, in other words, lead atom, zirconium atom, titanium atom, and oxygen atom. Pb and Ti are selectable for sputtering as oxides. Upon anticipating the slight decrease in the composition during hydrothermal treatment and the sputtering yield, the amount of sample atoms is adjusted such that the composite ratio of the PZT composition, Pb ($Zr_{0.56}$ $Ti_{0.44}$) $O_3$ for example, is maintained as per stoichiometry after crystallization. The well-known sputtering device may be used for the sputtering processing, and a high-frequency sputtering method maybe employed. Sputtering conditions are adjusted such that a film may be formed preferably within a range of the known art. For example, without heating during the sputtering, the sputtering voltage is set to 500W and the sputtering time is set for 80 minutes. Argon (Ar) is used for the sputtering gas and the atmospheric gas pressure is set to 4Pa. The sputtering conditions and methods, however, are not limited to the above.

Next, hydrothermal treatment is performed for crystallizing the amorphous PZT precursor film formed by sputtering. Water is foremost filled in a water tank. The precursor film sputtered in the aforementioned step is submerged in the water tank inclusive of the substrate, and the crystallization thereof is promoted in an autoclave under a prescribed condition. The condition of the water, for example, is set such that pH is adjusted to 7. The hydrothermal treatment pressure is set between 2 atmospheric pressure and 20 atmospheric pressure. Preferably, the pressure is set to approximately 10 atmospheric pressure. The hydrothermal treatment temperature is set in a range between 120° C. and 250° C. Preferably, the treatment temperature is set to approximately 200° C. The hydrothermal treatment time is set between 10 minutes and 60 minutes. The treatment time is set to 30 minutes for example.

Finally, a top electrode is formed on the crystallized oxide-ceramics film using the electronic beam vaporization method, sputtering method, and the like. Platinum (Pt) is used as the top electrode material, and the thickness thereof is made to be approximately 100 nm.

Performing hydrothermal treatment under water for crystallization as mentioned above yields the following advantages:

1) As the solution to contact the precursor film is water, the oxide-ceramics film is not etched;

2) As the solution to contact the precursor film is water, the composition of the oxide ceramics film does not change;

3) As water does not affect the electrodes and substrate when an oxide-ceramics film is formed thereon, the selection of electrode materials and substrate materials widens;

4) As water does not affect compositions other than electrodes as well, such as substrates, the selection of compositions widens;

5) As an alkaline aqueous solution is not used in the preparing process, no waste fluid poisonous to the natural environment will be discharged and contribution toward the preservation of the natural environment is possible; and 6) As water in inexpensive, the manufacturing cost is reduced.

Furthermore, although the above examples use the crystal-growth method upon forming the PZT film with the sol-gel method, other than the sol-gel method, the MOD (Metallo-Organic Decomposition) method and sputtering method may be used to form the amorphous film. The film material is not limited to lead zirconate titanate (Pb (Zr, Ti) $O_3$: PZT), and the present invention may be applied to other ceramics materials, such as lead lanthanum titanate ((Pb, La) $TiO_3$), lead lanthanum zirconate ((Pb, La) $ZrO_3$), lead lanthanum zirconate titanate ((Pb, La) (Zr, Ti) $O_3$: PLZT), lead magnesium niobate zirconate titanate (Pb (Mg, Nb) (Zr, Ti) $O_3$: PMN-PZT), strontium titanate, lithium niobate, zirconia, Y-1, ITO, and so on.

Accordingly, by utilizing the method of forming an oxide-ceramics film of the present invention, it is possible to control the amount of oxygen in the oxide-ceramics film and to form an oxide-ceramics film with little oxygen deficiency.

In addition, by employing the method of forming an oxide-ceramics film of the present invention to the pyrolyzing step upon forming a ceramics film with the sol-gel method, cracks are difficult to be formed.

Moreover, as hydrothermal treatment is performed under water upon crystallization of the oxide-ceramics film, the film and other materials are not affected thereby. Thus provided is a preparing method which allows a broad selection of materials, is inexpensive, and does not pollute the environment.

We claim:

1. A method of forming an oxide-ceramics film, comprising;

a step of forming an amorphous film on an arbitrary substrate; and a step of crystallizing said amorphous film, wherein during said step of crystallizing said amorphous film, a hydrothermal treatment to crystallize said amorphous film is performed while said amorphous film is submerged in a liquid water.

2. The method of forming an oxide-ceramics film according to claim wherein the step of crystallizing said amorphous film by said hydrothermal treatment is performed in said liquid water with a pH is of 7.

3. The method of forming an oxide-ceramics film according to claim wherein the step of crystallizing said amorphous film by said hydrothermal treatment is performed at a pressure of said in a range between 2 and 20 atmospheric pressure.

4. The method of forming an oxide-ceramics film according to claim 1, wherein the step of crystallizing said amorphous film by said hydrothermal treatment is performed at a temperature in a range between 120° C. and 250° C.

* * * * *

UNITED STATES PATENT AND TRADEMARK OFFICE
CERTIFICATE OF CORRECTION

PATENT NO. : 6,455,106 B1
DATED : September 24, 2002
INVENTOR(S) : Qiu et al.

It is certified that error appears in the above-identified patent and that said Letters Patent is hereby corrected as shown below:

Column 1,
Line 1, delete "she" and insert -- the -- therefor.

Column 5,
Line 40, delete "is:not" and insert -- is not -- therefor.

Column 8,
Lines 22 and 26, insert -- 1 -- after "claim".

Signed and Sealed this

Twenty-fourth Day of June, 2003

JAMES E. ROGAN
*Director of the United States Patent and Trademark Office*